United States Patent
Gan et al.

(10) Patent No.: US 8,177,989 B2
(45) Date of Patent: May 15, 2012

(54) COPPER CONDUCTING WIRE STRUCTURE AND FABRICATING METHOD THEREOF

(75) Inventors: Feng-Yuan Gan, Hsinchu (TW);
Han-Tu Lin, Taichung County (TW);
Kuo-Yuan Tu, Miaoli County (TW)

(73) Assignee: AU Optronics Inc. (TW)

( * ) Notice: Subject to any disclaimer, the term of this patent is extended or adjusted under 35 U.S.C. 154(b) by 923 days.

(21) Appl. No.: 11/889,234

(22) Filed: Aug. 10, 2007

(65) Prior Publication Data

US 2007/0278178 A1      Dec. 6, 2007

Related U.S. Application Data

(62) Division of application No. 11/219,718, filed on Sep. 7, 2005, now Pat. No. 7,289,183.

(30) Foreign Application Priority Data

May 25, 2005   (TW) .............................. 94117136 A

(51) Int. Cl.
*C30B 33/00* (2006.01)

(52) U.S. Cl. ................ 216/23; 216/32; 216/37; 216/41; 216/75; 216/100; 438/30; 438/331; 438/402; 438/404; 438/974

(58) Field of Classification Search ................ 216/23, 216/32, 37, 41, 75, 100; 438/30, 331, 402, 438/404, 974

See application file for complete search history.

(56) References Cited

U.S. PATENT DOCUMENTS

| | | | |
|---|---|---|---|
| 5,467,882 A * | 11/1995 | Ahn ............................. | 216/23 |
| 6,111,619 A | 8/2000 | He et al. | |
| 6,219,125 B1 * | 4/2001 | Ishikura et al. .............. | 349/147 |
| 6,255,706 B1 | 7/2001 | Watanabe et al. | |
| 6,319,741 B1 | 11/2001 | Izumi et al. .................... | 438/30 |
| 6,506,675 B1 | 1/2003 | Oomiya et al. ............... | 438/677 |
| 6,562,668 B2 | 5/2003 | Jang et al. | |
| 6,674,502 B1 | 1/2004 | Terakado et al. | |
| 7,157,323 B2 | 1/2007 | Gan et al. ..................... | 438/197 |
| 2003/0112382 A1 | 6/2003 | Takahashi et al. | |
| 2004/0041958 A1 | 3/2004 | Hwang et al. | |
| 2004/0058527 A1 * | 3/2004 | Yamazaki et al. ........... | 438/643 |
| 2004/0097024 A1 | 5/2004 | Doi | |
| 2004/0232443 A1 | 11/2004 | Cho et al. | |

* cited by examiner

*Primary Examiner* — Nadine G Norton
*Assistant Examiner* — Christopher Remavege
(74) *Attorney, Agent, or Firm* — Bacon & Thomas, PLLC

(57) ABSTRACT

A copper conducting wire structure is for use in the thin-film-transistor liquid crystal display (LCD) device. The copper conducting wire structure includes at least a buffer layer and a copper layer. A fabricating method of the copper conducting wire structure includes the following steps. At first, a glass substrate is provided. Next, the buffer layer is formed on the glass substrate. The buffer layer is comprised of a copper nitride. At last, the copper layer is formed on the buffer layer.

11 Claims, 4 Drawing Sheets

US 8,177,989 B2

COPPER CONDUCTING WIRE STRUCTURE AND FABRICATING METHOD THEREOF

This application is a divisional application of pending U.S. application Ser. No. 11/219,718 filed Sep. 7, 2005 (of which the entire disclosure of the pending, prior application is hereby incorporated by reference).

This application claims the benefit of Taiwan application Serial No. 94117136, filed May 25, 2005, the subject matter of which is incorporated herein by reference.

BACKGROUND OF THE INVENTION

1. Field of the Invention

The invention relates in general to a copper conducting wire structure and a fabricating method thereof, and more particularly to a copper conducting wire structure having a buffer layer and a fabricating method thereof.

2. Description of the Related Art

Thin film transistor planar display, the thin film transistor liquid crystal display (TFT-LCD) in particular, mainly uses the thin film transistor arranged in matrix and appropriate electronic components such as capacitor and adaptor to drive liquid crystal pixels so that rich colored patterns can be generated. The TFT-LCD having the features of slimness, low power-consumption and low radiation is now widely used in portable electronic products such as notebook and personal digital assistant (PDA). Even the conventional cathode ray tube (CRT) monitor of the desktop computer is now gradually replaced by the liquid crystal monitor.

The conducting wire of the structure of the TFT-LCD is mainly made of aluminum alloy or aluminum composite film. To overcome the RC delay problem generated by large-sized and high resolution TFT-LCD or LCD-TV, the conducting wire is made of material having a high electric conductivity. The most commonly used materials for the conducting wire include copper (Cu) whose electric conductivity is approximately equal to $1.7 \times 10^{-6}$ Ω-cm, aluminum (Al) whose electric conductivity is approximately equal to $2.6 \times 10^{-6}$ Ω-cm, titanium (Ti) whose electric conductivity is approximately equal to $41.6 \times 10^{-6}$ Ω-cm, molybdenum (Mo) whose electric conductivity is approximately equal to $5.7 \times 10^{-6}$ Ω-cm, chromium (Cr) whose electric conductivity is approximately equal to $12.8 \times 10^{-6}$ Ω-cm, nickel (Ni) whose electric conductivity is approximately equal to $6.8 \times 10^{-6}$ Ω-cm. Therefore, using copper whose electric conductivity is higher to replace aluminum or aluminum alloy conducting wire whose electric conductivity is lower has become a hot topic of research in the industry.

Referring to FIG. 1, a cross-sectional view of a conventional copper conducting wire structure is shown. According to conventional fabricating method of copper conducting wire structure, at first, a copper layer is sputtered on a glass substrate 101. Next, the copper layer is etched to form patterned copper layer 103 according to micro-filming manufacturing process. After that, subsequent manufacturing processes would follow. For example, a silicon-oxide layer 105, an amorphous Silicon (a-Si) layer 107 and an n+a-Si layer 109 are sequentially formed on the patterned copper layer 103.

Despite that copper conducting wire structure has a better conductivity, the poor adhesion between copper and glass results in a poor bonding strength between the patterned copper layer and the glass substrate, reducing the electric conductivity of the copper conducting wire structure.

SUMMARY OF THE INVENTION

It is therefore the object of the invention to provide a copper conducting wire structure and the fabricating method thereof. With a buffer layer comprised of copper nitride being formed between the copper layer and the glass substrate, the bonding strength between the copper layer and the glass substrate is further enforced.

According to the object of the invention, a copper conducting wire structure for use in thin-film-transistor liquid crystal display (TFT-LCD) is provided. The copper conducting wire structure at least includes a glass substrate, a patterned buffer layer and a patterned copper layer. The patterned buffer layer is comprised of a copper nitride. The patterned buffer layer is formed on the glass substrate. The patterned copper layer is formed on and opposite to the patterned buffer layer.

According to the object of the invention, a method of fabricating a copper conducting wire structure is further provided. The method includes the following steps. At first, a glass substrate is provided. Next, a buffer layer is formed on the glass substrate. The buffer layer is comprised of a copper nitride. At last, a copper layer is formed on the buffer layer.

Other objects, features, and advantages of the invention will become apparent from the following detailed description of the preferred but non-limiting embodiments. The following description is made with reference to the accompanying drawings.

DETAILED DESCRIPTION OF THE INVENTION

According to the invention, a buffer layer comprised of a copper nitride is formed between a copper layer and a glass substrate to enhance the bonding strength between the copper layer and the glass substrate. The copper conducting wire structure of the invention for use in a thin film transistor liquid crystal display (TFT-LCD) is exemplified below. Considering the slight differences of the structure and the fabricating method, a first embodiment and a second embodiment within the scope of the spirit and technology of the invention are respectively provided. However, the scope of protection of the invention is not limited by the embodiments, neither is the technology of the invention limited thereto.

First Embodiment

Figure 1:
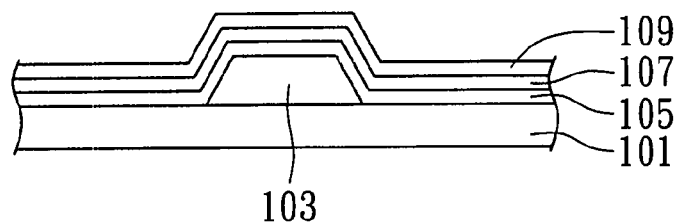
FIG. 1 (Related Art) is a cross-sectional view of a conventional copper conducting wire structure.
Figure 2A:
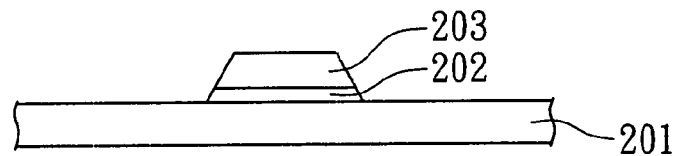
FIG. 2A is a cross-sectional view of a copper conducting wire structure according to a first embodiment of the invention.

Referring to FIG. 2A, a cross-sectional view of a copper conducting wire structure according to a first embodiment of the invention is shown. In the present embodiment, the copper conducting wire structure is for use in a TFT-LCD. The copper conducting wire structure at least includes a glass substrate 20, a patterned buffer layer 202 and a patterned copper layer 203.

The patterned buffer layer 202 is comprised of a copper nitride. The patterned buffer layer 202 is formed on the glass substrate 20. The thickness of the patterned buffer layer 202 is substantially smaller than 300 nm, and is preferably smaller than 100 nm.

The patterned copper layer 203 is formed on the patterned buffer layer 202 and opposite to the patterned buffer layer 202. The patterned copper layer 203 can be a patterned copper alloy layer. The patterned buffer layer 202 comprised of copper nitride is formed between the patterned copper layer 203 and the glass substrate 201 to enhance the bonding strength between the patterned copper layer 203 and the glass substrate 201.

Figure 2B:
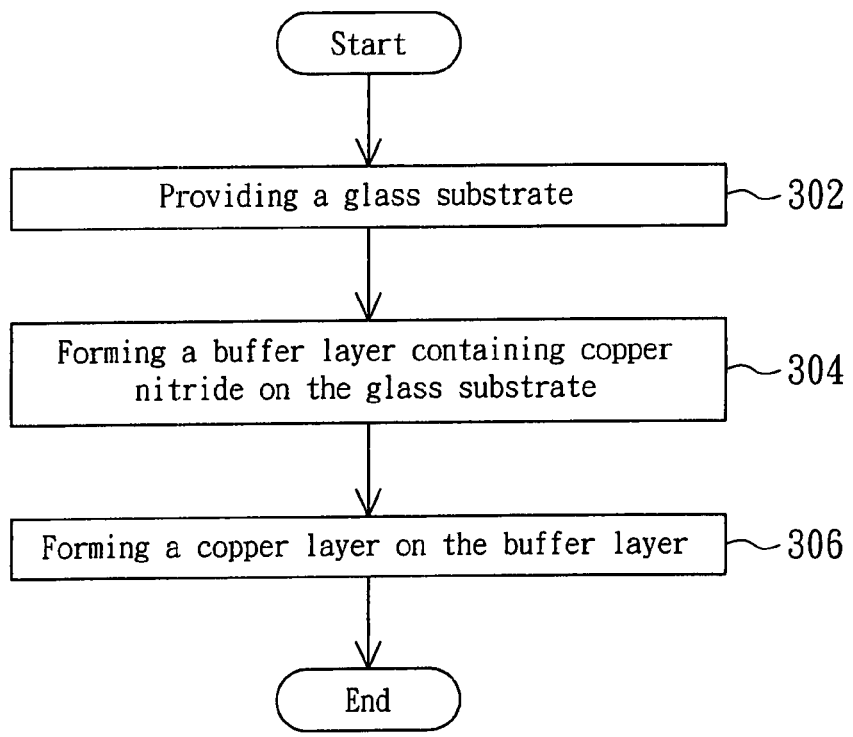
FIG. 2B is a flowchart of a fabricating method of the copper conducting wire structure according to the first embodiment of the invention.

Referring to both FIG. 2B and FIGS. 3A~3D, FIG. 2B is a flowchart of a fabricating method of the copper conducting wire structure according to the first embodiment of the invention, while FIGS. 3A~3D are diagrams showing the fabricating method in FIG. 2B. In the present embodiment, the fabricating method of the copper conducting wire structure includes steps 302~306.

Figure 3A:
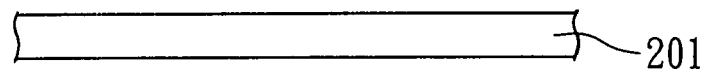
FIG. 3A~3D are diagrams showing the fabricating method in FIG. 2B.

At first, as shown in step 302 and FIG. 3A, a glass substrate 201 is provided.

Figure 3B:
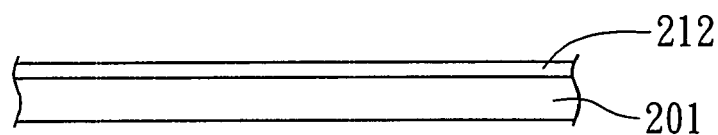

Next, as shown in step 304 and FIG. 3B, a buffer layer 212 comprised of a copper nitride is formed on the glass substrate 201 through sputtering process for instance. For example, a copper target opposite to the glass substrate 201 is provided. Then, argon (Ar) and nitrogen (N) are infused into a chamber. The ratio of the flow of argon to that of nitrogen ranges from 1:1 to 1:20. Next, the buffer layer 212 is formed on the glass substrate 201 through sputtering process for the buffer layer 212 to being comprised of copper nitride.

Figure 3C:
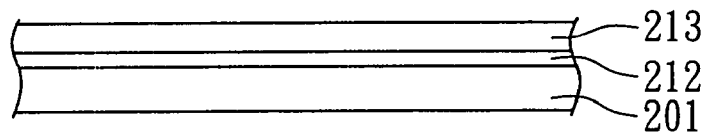
Figure 3D:
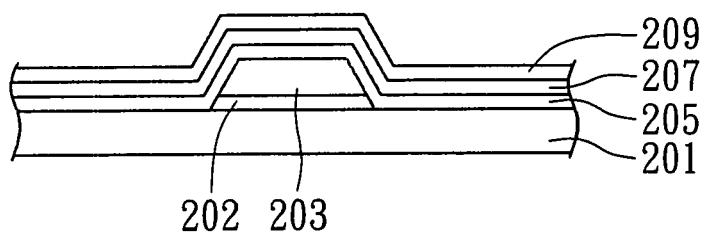

Then, as shown in step 306 and FIG. 3C, a copper layer 213 is formed on the buffer layer 212 through sputtering process for instance. For example, a copper target is provided. Next, argon is infused into the chamber. Then, the copper layer 213 is formed on the buffer layer 212 through sputtering process.

In step 306, the copper layer 213 can also be a copper alloy layer. For example, the copper alloy layer is formed on the buffer layer 212 through sputtering process. For example, a copper target and a metal target are provided. Next, argon is infused into a chamber. Then, the copper alloy layer is formed on the buffer layer 212 through sputtering process.

In step 304 and step 306, the buffer layer 212 and the copper layer 213 can be formed at the same chamber and use the same copper target through sputtering process, so that the manufacturing process of fabricating the copper conducting wire structure is further simplified. When forming the buffer layer 212, argon and nitrogen are infused into the chamber. When forming the copper layer 213, the sputtering process can be started by closing the valve of nitrogen and infusing argon into the chamber. If the targets are made of different materials, the operator has to bleed the gas from the chamber, replace the target, and take one day to form a vacuum state so that the next step of sputtering process can be started. Following this process, the buffer layer 212 and the copper layer 213 are sequentially formed, and the required time for fabricating the copper conducting wire structure of the present embodiment is thus shortened.

Referring to both FIG. 2A and FIG. 3C, in the wake of step 306, the fabricating method of copper conducting wire structure further includes the step of patterning the copper layer 213 and the buffer layer 212 to form the patterned copper layer 203 and the patterned buffer layer 202. For example, a photo-resist layer is formed on the copper layer 213. Next, the photo-resist layer is exposed and developed to form a photo-resist pattern. Then, the copper layer 213 and the buffer layer 212 are etched according to the photo-resist pattern to form the patterned copper layer 203 and the patterned buffer layer 202. Then, the photo-resist pattern is removed.

Afterwards, subsequent manufacturing processes are performed. Take FIG. 3D for example, a silicon-oxide layer 205, an amorphous Silicon (a-Si) layer 207 and an n+a-Si layer 209 are sequentially formed on the patterned copper layer 203.

Second Embodiment

Figure 4A:
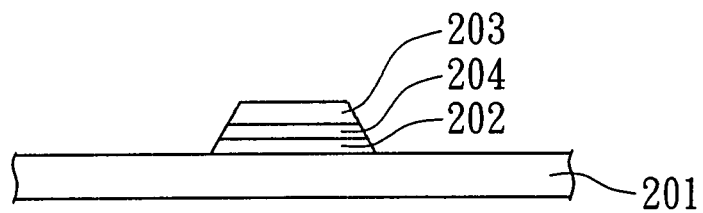
FIG. 4A is a cross-sectional view of a copper conducting wire structure according to a second embodiment of the invention.

Referring to FIG. 4A, a cross-sectional view of a copper conducting wire structure according to a second embodiment of the invention is shown. The copper conducting wire structure of the present embodiment is for use in a TFT-LCD. The copper conducting wire structure at least includes a patterned buffer layer 202, a patterned copper alloy layer 204 and a patterned copper layer 203.

The patterned buffer layer 202 is comprised of copper nitride. The patterned buffer layer 202 is formed on a glass substrate 201. The thickness of the patterned buffer layer 202 is substantially smaller than 300 nm, and is preferably smaller than 100 nm.

The patterned copper alloy layer 204 is formed on the patterned buffer layer 202 and opposite to the patterned buffer layer 202. The patterned copper alloy layer 204 can stabilize the patterned buffer layer 202, enabling the copper conducting wire structure of the present embodiment to have better conductivity.

The patterned copper layer 203 is formed on and opposite to the patterned copper alloy layer 204. The patterned buffer layer 202 is comprised of a copper nitride and the patterned copper alloy layer 204 are formed between the patterned copper layer 203 and the glass substrate 201, so the bonding between the patterned copper layer 203 and the glass substrate 201 can be further enforced.

Figure 4B:
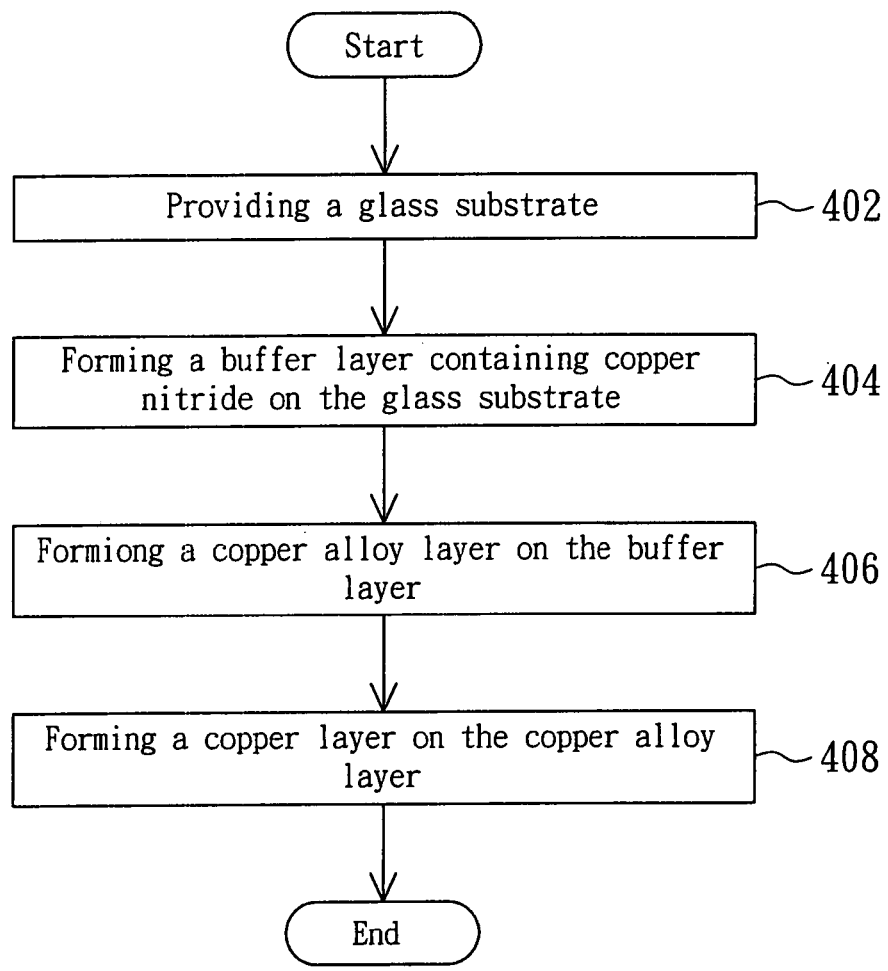
FIG. 4B is a flowchart of a fabricating method of the copper conducting wire structure according to the second embodiment of the invention.

Referring to both FIG. 4B and FIG. 5A~5E, FIG. 4B is a flowchart of a fabricating method of the copper conducting wire structure according to the second embodiment of the invention, while FIG. 5A~5E are diagrams showing the fabricating method in FIG. 4B. The fabricating method of the copper conducting wire structure of the present embodiment includes steps 402~408.

Figure 5A:
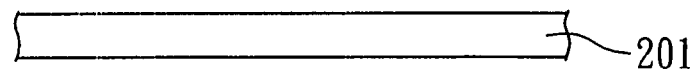
FIG. 5A~5E are diagrams showing the fabricating method in FIG. 4B.

At first, as shown in step 402 and FIG. 5A, a glass substrate 201 is provided.

Figure 5B:
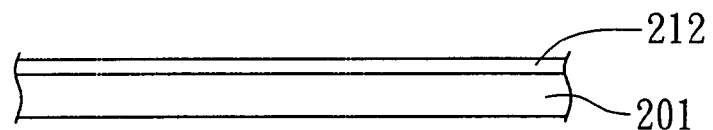

Next, as shown in step 404 and FIG. 5B, a buffer layer 212 comprised of a copper nitride is formed on the glass substrate 201 through sputtering process for instance. For example, a copper target opposite to the glass substrate 201 is provided. Then, argon (Ar) and nitrogen (N) are infused into a chamber. The ratio of the flow of argon to that of nitrogen ranges from 1:1 to 1:20. Next, the buffer layer 212 is formed on the glass substrate 201 through sputtering process for the buffer layer 212 to be comprised of copper nitride.

Figure 5C:
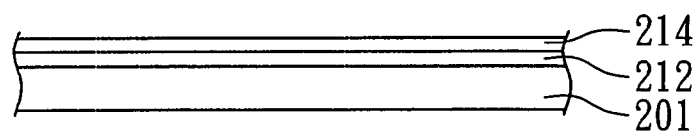

Then, as shown in step 406 and FIG. 5C, a copper alloy layer 214 is formed on the buffer layer 212 through sputtering process for instance. For example, a copper target and a metal target are provided. Next, argon is infused into the chamber. Then, the copper alloy layer 214 is formed on the buffer layer 212 through sputtering process.

Figure 5D:
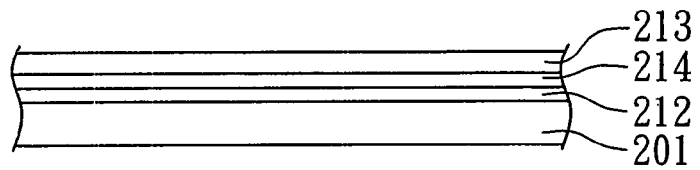
Figure 5E:
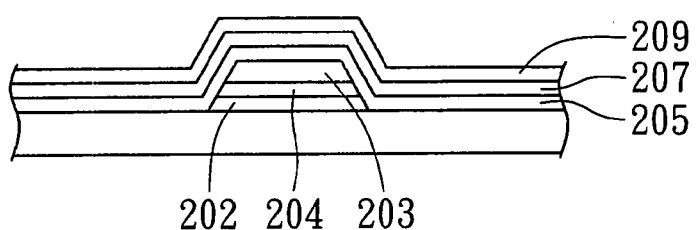

Then, as shown in step 408 and FIG. 5D, a copper layer 213 is formed on the copper alloy layer 214 through sputtering process for instance. For example, a copper target is provided.

Next, argon is infused into the chamber. Then, the copper layer 213 is formed on the copper alloy layer 214 through sputtering process.

In step 404, step 406 and step 408, the buffer layer 212, the copper alloy layer 214 and the copper layer 213 can be formed at the same chamber and use the same copper target through sputtering process, so that the manufacturing process of fabricating the copper conducting wire structure is further simplified. When forming the buffer layer 212, argon and nitrogen are infused into the chamber. When forming the copper layer 213, the same copper target is used and argon is infused into the chamber. Following this process, the buffer layer 212, the copper alloy layer 214 and the copper layer 213 are sequentially formed. The required time for fabricating the copper conducting wire structure of the present embodiment is shortened by forming the copper alloy layer 214 and the copper layer 213 at the same chamber through sputtering process.

Referring to both FIG. 4A and FIG. 5D, the fabricating method of copper conducting wire structure of the second embodiment is shown. In the wake of step 408, the method can further includes a step of patterning the copper layer 213, the copper alloy layer 214 and the buffer layer 212 to form the patterned copper layer 203, the patterned copper alloy layer 204 and the patterned buffer layer 202. For example, a photo-resist layer is formed on the copper layer 213. Next, the photo-resist layer is exposed and developed to form a photo-resist pattern. Then, the copper layer 213, the copper alloy layer 214 and the buffer layer 212 are etched according to the photo-resist pattern to form the patterned copper layer 203, the patterned copper alloy layer 204 and the patterned buffer layer 202. Then, the photo-resist pattern is removed.

Afterwards, subsequent manufacturing processes are performed. Take FIG. 5E for example, a silicon-oxide layer 205, an amorphous Silicon (a-Si) layer 207 and an n+a-Si layer 209 are sequentially formed on the patterned copper layer 203.

According to the above embodiments, the copper conducting wire structure and the fabricating method thereof improve the poor bonding strength between the copper layer and the glass substrate by forming a buffer layer comprised of a copper nitride between a copper layer and a glass substrate. If a copper alloy layer is formed between the copper layer and the buffer layer, the buffer layer comprised of copper nitride is stabilized and the electric conductivity of the copper conducting wire structure is increased. Therefore, the copper conducting wire structure and fabricating method thereof can effectively resolve the problem of poor adhesion between the copper layer and the glass substrate, enabling the device using the copper conducting wire structure of the above embodiments to have better conductivity.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a copper conducting wire structure, comprising:
    providing a glass substrate;
    forming a buffer layer on the glass substrate;
    forming a copper alloy layer on the buffer layer; and
    forming a copper layer on the copper alloy layer;
    wherein the buffer layer is a copper nitride.

2. The method according to claim 1, wherein the copper layer is a copper alloy layer.

3. The method according to claim 1, wherein the buffer layer is formed through sputtering process.

4. The method according to claim 3, wherein the step of forming the buffer layer on the glass substrate further comprises:
    providing a copper target opposite to the glass substrate;
    infusing argon (Ar) and nitrogen (N) into a chamber; and
    forming the buffer layer on the glass substrate through sputtering process, wherein the buffer layer is comprised of a copper nitride.

5. The method according to claim 4, wherein the step of forming the copper layer on the copper alloy layer further comprises:
    adopting the copper target;
    infusing argon into the chamber; and
    forming the copper layer on the copper alloy layer through sputtering process.

6. The method according to claim 1, wherein the copper layer is formed through sputtering process.

7. The method according to claim 1, wherein the thickness of the buffer layer is smaller than about 300 nm.

8. The method according to claim 1, wherein the thickness of the buffer layer is smaller than about 100 nm.

9. The method according to claim 1, further comprising:
    patterning the copper layer, the copper alloy layer and the buffer layer to form a patterned copper layer, a patterned copper alloy layer and a patterned buffer layer after the step of forming the copper layer on the copper alloy layer.

10. The method according to claim 9, wherein the step of patterning the copper layer, the copper alloy layer and the buffer layer comprises:
    forming a photo-resist layer on the copper layer;
    exposing and developing the photo-resist layer to form a photo-resist pattern;
    etching the copper layer, the copper alloy layer and the buffer layer according to the photo-resist pattern to form the patterned copper layer, the patterned copper alloy layer and the patterned buffer layer; and
    removing the photo-resist pattern.

11. The method according to claim 1, wherein the buffer layer includes no metal component other than copper.

* * * * *

UNITED STATES PATENT AND TRADEMARK OFFICE
CERTIFICATE OF CORRECTION

PATENT NO.        : 8,177,989 B2                         Page 1 of 1
APPLICATION NO.   : 11/889234
DATED             : May 15, 2012
INVENTOR(S)       : Feng-Yuan Gan et al.

It is certified that error appears in the above-identified patent and that said Letters Patent is hereby corrected as shown below:

On the title page, item [73] should read:

-- (73) Assignee: AU Optronics ~~Inc.~~ Corp. (TW) --.

Signed and Sealed this
Eighth Day of October, 2013

Teresa Stanek Rea
*Deputy Director of the United States Patent and Trademark Office*